(12) United States Patent
Terashima et al.

(10) Patent No.: US 6,453,000 B1
(45) Date of Patent: Sep. 17, 2002

(54) EXPOSURE METHOD, EXPOSURE DEVICE AND SEMICONDUCTOR DEVICE MANUFACTURING METHOD

(75) Inventors: Shigeru Terashima, Utsunomiya; Hideki Ina, Yokohama, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 146 days.

(21) Appl. No.: 09/590,184

(22) Filed: Jun. 9, 2000

(30) Foreign Application Priority Data

Jun. 14, 1999 (JP) .......................................... 11-167420

(51) Int. Cl.$^7$ ................................................ G21K 5/00
(52) U.S. Cl. ............................................ 378/34; 378/205
(58) Field of Search ............................ 378/34, 205, 150, 378/160

(56) References Cited

U.S. PATENT DOCUMENTS

| 5,125,014 A | 6/1992 | Watanabe et al. .............. 378/34 |
| 5,157,700 A | 10/1992 | Kurosawa et al. ............. 378/34 |
| 5,600,698 A | 2/1997 | Terashima et al. ............ 378/34 |
| 5,606,586 A | 2/1997 | Amemiya et al. ............. 378/34 |

*Primary Examiner*—Robert H. Kim
*Assistant Examiner*—Courtney Thomas
(74) *Attorney, Agent, or Firm*—Fitzpatrick, Cella, Harper & Scinto (57) ABSTRACT

An exposure apparatus for exposing a photosensitive substrate to a pattern within an exposure view angle on a mask using X-rays to transfer the pattern onto the photosensitive substrate, wherein the exposure view angle is limited by a light blocking plate for blocking the X-rays, and the alignment mark is disposed on a scribe line, thus effectively manufacturing semiconductor devices.

7 Claims, 10 Drawing Sheets

EXPOSURE METHOD, EXPOSURE DEVICE AND SEMICONDUCTOR DEVICE MANUFACTURING METHOD

FIELD OF THE INVENTION AND RELATED ART

The present invention relates to an exposure method and an exposure device, which is particularly suitable for exposure and transfer operations of a step-and-repeat type and a step-and-scan type in which a photosensitive substrate such as a wafer or a glass substrate coated with a photosensitive material is exposed to a fine electronic circuit pattern formed on a surface of a mask using X-rays such as from synchrotron radiation (SR) or a plasma X-ray radiation source. In an exposure apparatus for manufacturing fine devices, alignment between the mask and the wafer is one of the important factors in terms of improvement of the performance of the devices. Particularly, the alignment in the recent exposure apparatus requires an alignment accuracy of less than a submicron to meet the demand for highly integrated devices (semiconductor element). The many alignment systems, alignment patterns (alignment marks) are provided on the surface of the mask and the surface of the wafer on scribe lines, and using the positional information obtained from the alignment marks, the mask and the wafer are aligned relative to each other (step-and-repeat type), and in such a system, the alignment mark for the alignment of the element pattern is disposed in the scribe line outside the element pattern area, and is exposed and transferred onto the wafer together with the circuit pattern on the mask.

Since the alignment mark does not have a function of an element, it is not needed after the completion of the lithography step. Therefore, the alignment pattern is disposed on the region of cutting between the elements.

The scribe lines are required to permit the wafer to be divided into a plurality of elements, but since they are not used for the element, the width thereof is minimized.

In a light exposure apparatus using exposure beam light such as i-line, an excimer laser beam or the like, a light blocking film is provided on the mask to limit the exposure view angle. If an attempt is made to limit the exposure view angle by an X-ray absorbing material on the mask in the case of the X line exposure device, several % to 40% of the X-rays pass through the absorbing material, depending on the thickness thereof.

In the exposure system using light, the use is made with a fine dot pattern at the peripheral portion of the half-tone reticle in the i-line exposure system, thus preventing the diffracted light from the reticle from entering the projection optical system. In the excimer laser exposure system, the introduction of the diffracted light to the projection optical system is not avoidable even in the finest pattern that can be drawn on the reticle with the result of the exposure of the marginal areas to the beam. The half-tone transmission factor in this case is approx 8%, but the exposure of the marginal area extends into the actual element with the result that a corner is influenced by four shot areas, and that an amount of blurriness due to the illumination system is 200μ on the wafer, which is quite large as compared with the scribe line, and therefore, even if a half-tone reticle is used, the peripheral portion has to be provided with a Cr film to block the light.

In the X-line exposure, there is generally provided a light blocking plate for blocking the X-rays in the exposure apparatus to limit the exposure view angle. In order to provide the exposure apparatus with a function of limiting the exposure view angle, the function of changing the exposure view angle in accordance with the area to be transferred (exposure area) of the mask is performed.

In order to limit the area to be transferred of the mask, it is necessary to move the light blocking plates in the four directions with high precision and to avoid mechanical interference with the mask and the mask supporting member. Therefore, it is unavoidable to dispose the light blocking plates substantially away from the mask. Then, a boundary region occurs on the mask, in which the amount of the projected X-rays gradually decreases due to the shade of the light blocking plate resulting from the size of the light source and positional relation between the light blocking plate and the mask and the influence of the diffraction of the X-ray at the end of the light blocking plate. This is called blurriness due to the penumbra produced by the light blocking plate.

Figure 9:
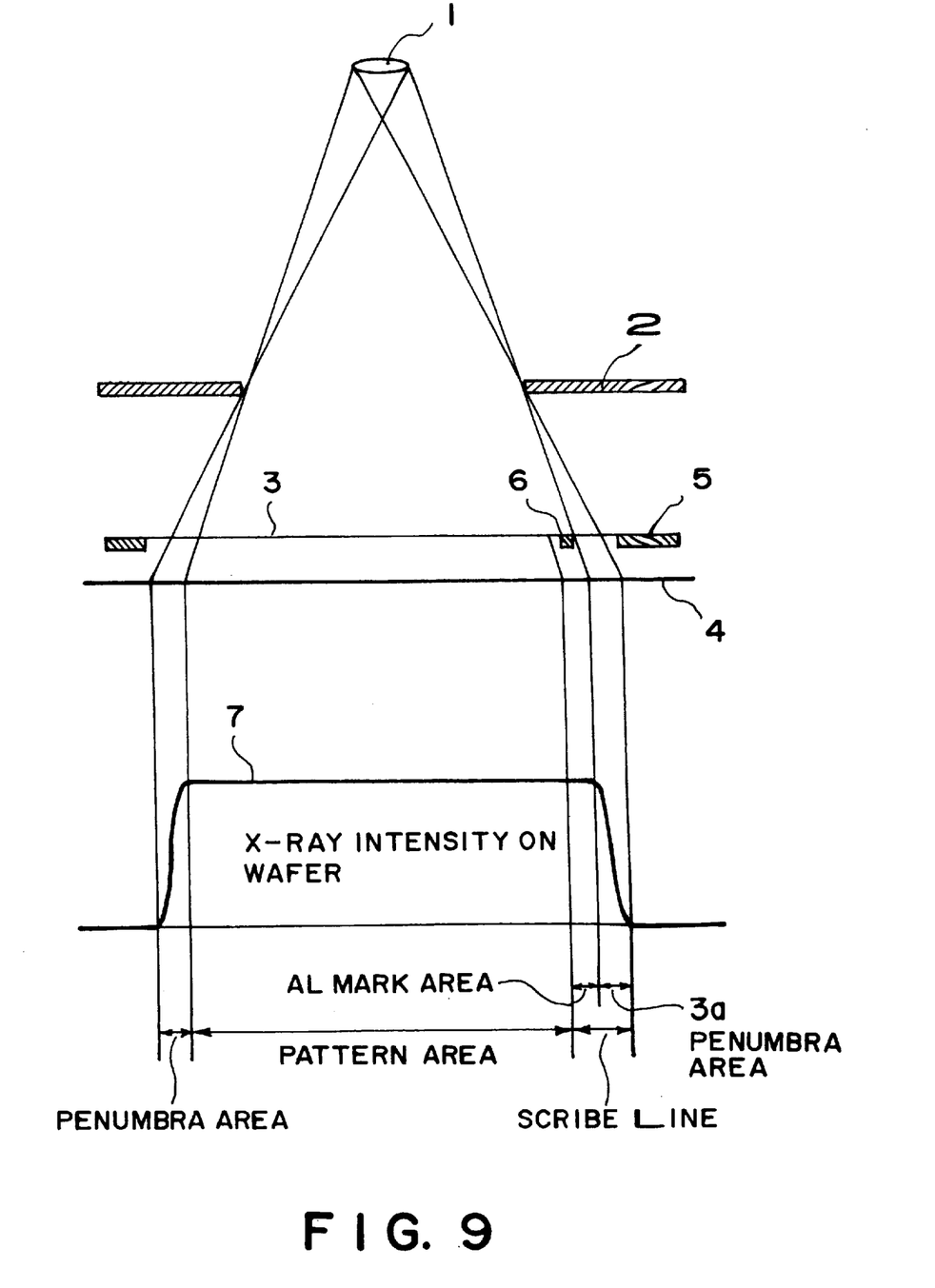
FIG. 9 is a schematic view of a major part of a conventional exposure apparatus using X-rays.

FIG. 9 shows a major part of an exposure apparatus using X-rays. In FIG. 9, designated by 1 is an X-ray radiation source, 2 is a light blocking plate for limiting an exposure view angle, 3 is a mask for X-line exposure, 4 is a wafer, 5 is an X-ray absorbing material disposed outside the exposure view angle of the mask 3, 6 is an alignment mark on the mask 3, and 7 is an intensity distribution of the exposure X-rays on the wafer 4.

As shown in the Figure, the penumbra region 3a is a region in which the intensity of the X-rays gradually decreases, and therefore, it is not used for the exposure. When the alignment mark 6 is disposed outside the element pattern area, the width of the scribe line is the region for disclosing the alignment 6 plus the penumbra region 3a, as shown in the Figure, that is, the width of the scribe line is large. As a result, the wasteful area on the mask is large, and therefore, the exposure efficiency is low when the pattern of the mask is projected and transferred onto the wafer.

SUMMARY OF THE INVENTION

Accordingly, it is a principal object of the present invention to provide an exposure method and an exposure apparatus wherein a pattern of the mask is projected and transferred onto the wafer using X-rays with high exposure and transfer efficiency without enlarging the width of the scribe line, so that devices are efficiently produced.

According to an aspect of the present invention, there is provided an exposure method using X-rays as exposure radiation, comprising: a step of preparing a light blocking plate, disposed in an optical path, for blocking the exposure radiation; a step of limiting an exposure view angle on a mask by the light blocking plate so that a penumbra region provided on the mask by the light blocking plate covers an alignment mark portion of the mask; wherein the alignment mark portion is disposed at least at one position inside a low light intensity region and outside an element pattern on the mask; and a step of exposing a photosensitive substrate to a pattern within the exposure view angle on the mask to transfer the pattern onto the photosensitive substrate.

Here, the alignment mark portion may be provided at each of outer sides of the element pattern on the mask.

According to another aspect of the present invention, there is provided an exposure method using X-rays as exposure radiation, comprising: a step of preparing a light blocking plate, disposed in an optical path, for blocking the exposure radiation; a step of limiting an exposure view angle on a mask by the light blocking plate so that a penumbra region provided on the mask by the light blocking plate covers an alignment mark portion of the mask; wherein the alignment mark portion is provided at each of positions which are outside of an element pattern on the mask and which are symmetric about a center line Lx of the mask and positions which are outside of an element pattern on the mask and which are symmetric about a center line Ly which is perpendicular to the center line Lx; and a step of exposing a photosensitive substrate to a pattern within the exposure view angle on the mask to transfer the pattern onto the photosensitive substrate.

According to a further aspect of the present invention, there is provided an exposure apparatus, using X-rays as exposure radiation, for exposing a photosensitive substrate to a pattern within an exposure view angle on a mask to transfer the pattern onto the photosensitive substrate, said apparatus comprising: a light blocking plate, disposed in an optical path for the exposure radiation, for limiting the exposure view angle on the mask by blocking the exposure radiation; and driving means for driving the light blocking plate such that a penumbra region provided on the mask by said light blocking plate covers an alignment mark portion formed on the mask, wherein the alignment mark portion is provided at least at one position in said low light intensity region and outside the element pattern on the mask.

According to a further aspect of the present invention, there is provided an exposure apparatus using X-rays as exposure radiation for exposing a photosensitive substrate to a pattern within an exposure view angle on a mask to transfer the pattern onto the photosensitive substrate, said apparatus comprising: a light blocking plate, disposed in an optical path for the exposure radiation, for limiting the exposure view angle on the mask by blocking the exposure radiation; driving means for driving the light blocking plate such that a penumbra region provided on the mask by said light blocking plate covers an alignment mark portion formed on the mask, wherein the alignment mark portion is provided at each of positions which are outside of an element pattern on the mask and which are symmetric about a center line Lx of the mask and positions which are outside of an element pattern on the mask and which are symmetric about a center line Ly which is perpendicular to the center line Lx.

According to a further aspect of the present invention, there is provided a semiconductor device manufacturing method comprising: a step of performing alignment between a mask and a photosensitive substrate; an exposure step for exposing the photosensitive substrate to a pattern within an exposure view angle on the mask to transfer the pattern onto the photosensitive substrate, using X-ray radiation as exposure radiation, said exposure step including: a step of preparing a light blocking plate, disposed in an optical path, for blocking the exposure radiation; a step of limiting an exposure view angle on a mask by the light blocking plate so that a penumbra region provided on the mask by the light blocking plate covers an alignment mark portion of the mask; wherein the alignment mark portion is provided at least at one position inside a low light intensity region and an outside an element pattern on the mask; and a step of developing the photosensitive substrate onto which the pattern has been transferred.

According to a further aspect of the present invention, there is provided a semiconductor device manufacturing method comprising: a step of performing alignment between a mask and a photosensitive substrate; an exposure step for exposing the photosensitive substrate to a pattern within an exposure view angle on the mask to transfer the pattern onto the photosensitive substrate, using X-ray radiation as exposure radiation, said exposure step including: a step of preparing a light blocking plate, disposed in an optical path, for blocking the exposure radiation; a step of limiting an exposure view angle on a mask by the light blocking plate so that a penumbra region provided on the mask by the light blocking plate covers an alignment mark portion of the mask; wherein the alignment mark portion is provided at each of positions which are outside of an element pattern on the mask and which are symmetric about a center line Lx of the mask and positions which are outside of an element pattern on the mask and which are symmetric about a center line Ly which is perpendicular to the center line Lx; and a step of developing the photosensitive substrate onto which the pattern has been transferred.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENT

Figure 1:
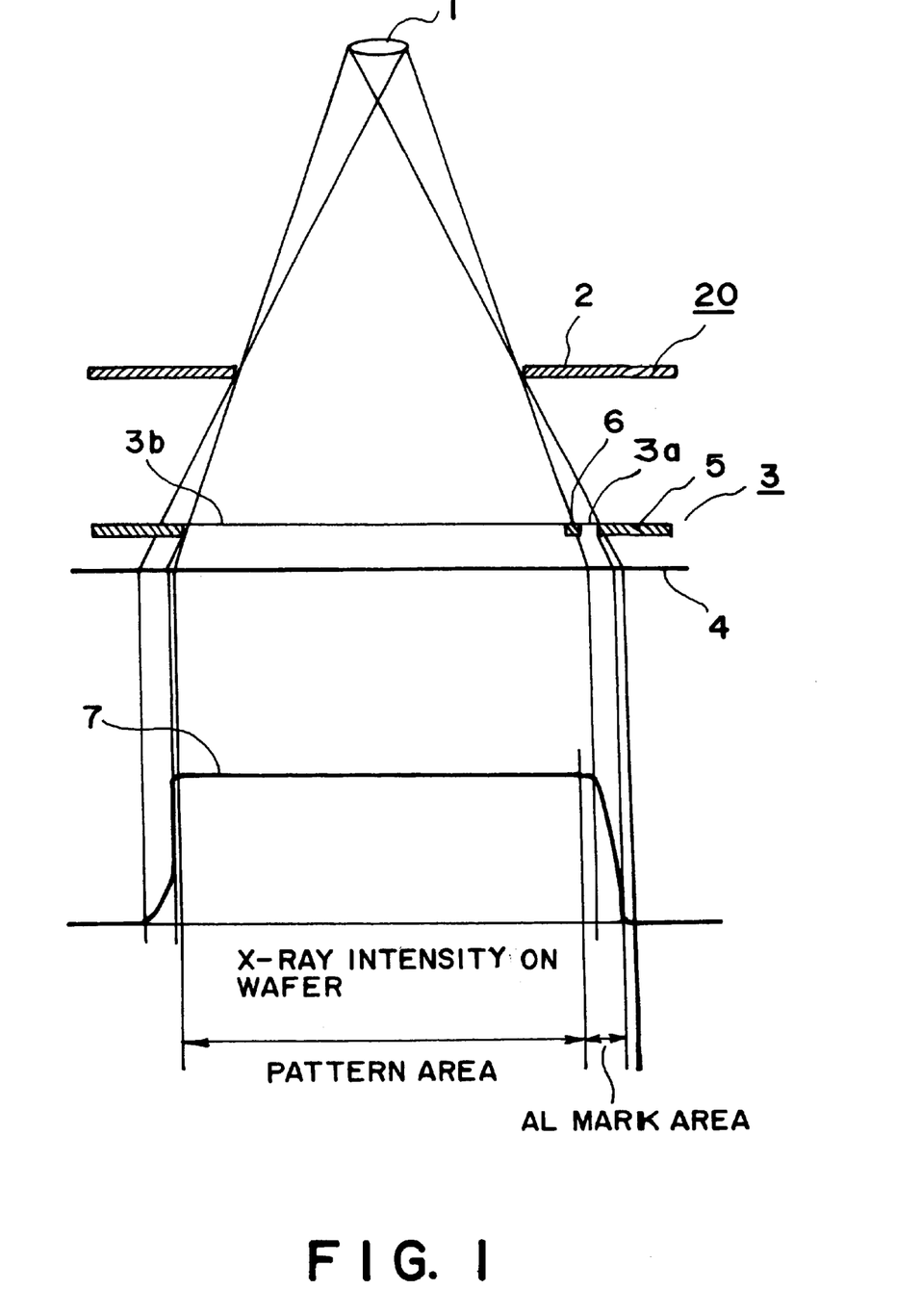
FIG. 1 schematically illustrates a major part of an exposure apparatus according to Embodiment 1 of the present invention.

FIG. 1 schematically shows a major part of an exposure apparatus using X-rays according to an embodiment of the present invention. The Figure shows a case of a proximity type exposure apparatus for performing semiconductor element manufacturing.

In FIG. 1, designated by 1 is an X-ray radiation source; 2 is a light blocking plate for limiting an exposure view angle; 3 is a mask for the X-line exposure which comprises a predetermined transfer pattern and an alignment mark. Designated by 4 is a wafer (photosensitive substrate); 5 is an X-ray absorbing material (light blocking portion, low light intensity region) disposed outside in the exposure view angle (transfer pattern) of the mask 3; 6 is an alignment mark on the mask; and 7 is an intensity distribution of the exposure X-rays on the wafer 4.

FIG. 1 schematically shows an example of one-to-one exposure using the X-rays. The exposure apparatus comprises aligning means, a shutter, stages for supporting the wafer or the mask, and a feeding device or the like, but they are omitted for simplicity of explanation.

The positional relation is schematically shown in the Figure, and, for example, when the X-ray radiation source is synchrotron radiation, the X-ray radiation source 1 is far away from the mask 3, whereas the mask 3 and the wafer 4 are spaced only by several tens of microns. The light blocking plate 2 for limiting the exposure view angle is supported on the exposure apparatus and is disposed approximately several mm to several tens of mm away from the surface of the mask 3 to permit movement thereof.

As shown in FIG. 12, in this embodiment, alignment marks 6 are provided at two adjacent sides of the outer circumference of the element pattern area 11, and a low light intensity region 5 or light blocking portion of X-ray absorbing material is formed outside the element pattern area and the alignment mark portion. The light blocking plate is disposed such that a region of a penumbra provided by the light blocking plate for blocking the X-rays for limiting the exposure view angle of the exposure apparatus is overlapped with the alignment mark.

Figure 2:
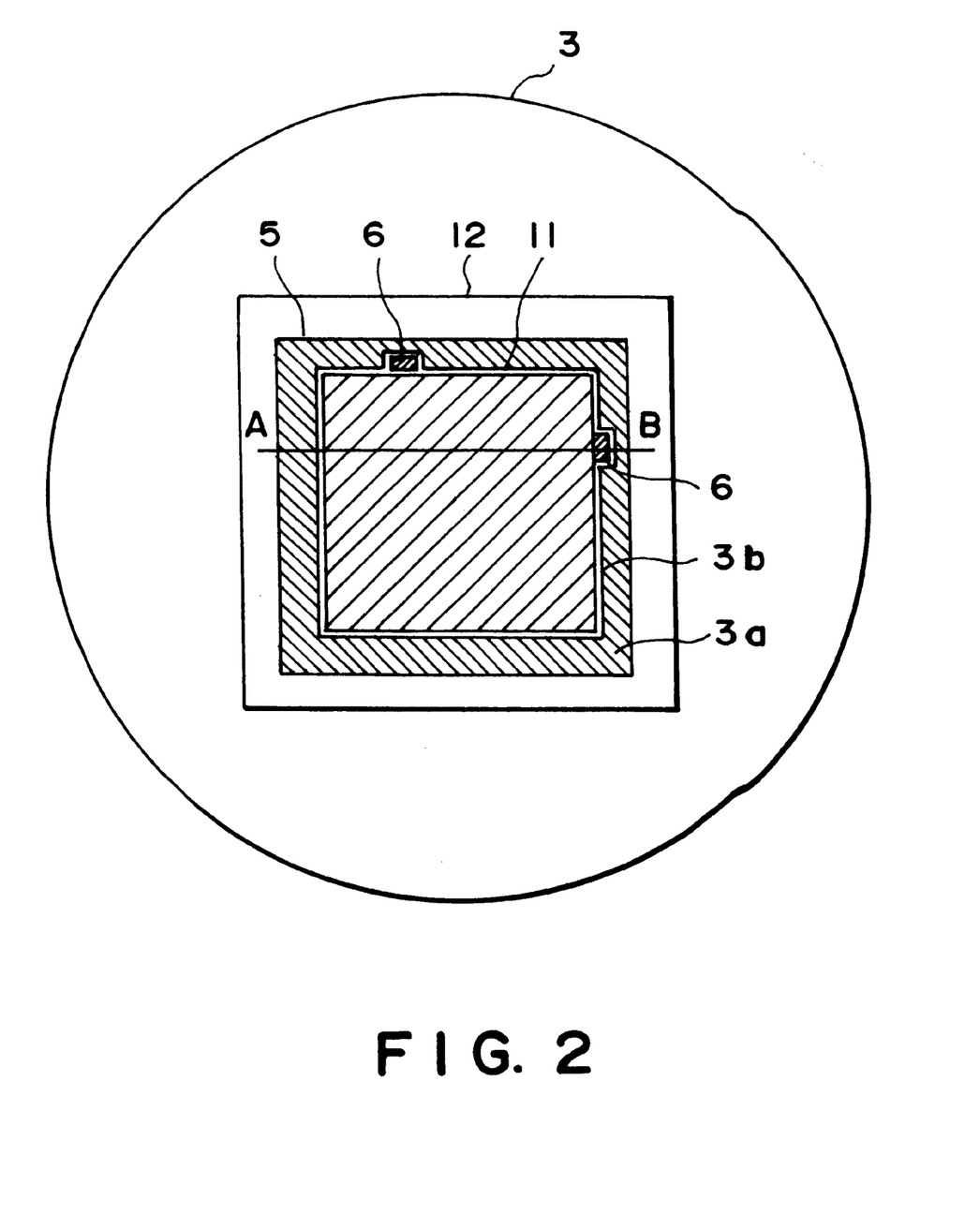
FIG. 2 is a top plan view of a major part of a mask in Embodiment 1 of the present invention in which it is not needed to expose the scribe line.

In this embodiment, as shown in FIG. 1, the penumbra (blurred portion) 3a of the projected X-rays provided by the light blocking plate 2 occurs on the mask 3 at the end portion of the exposure view angle, and the penumbra portion 3a is used for the exposure of the alignment mark 6. By doing so, the drawback of the large width of the scribe line necessitated by avoiding the area influenced by the penumbra can be avoided in the projection exposure using the X-line exposure. FIG. 2 is a top plan view showing a mask for the X-line exposure using the present invention. In FIG. 2, designated by 11 is an element pattern area and 12 is a window frame of the mask. In FIG. 2, the same reference numerals as in FIG. 1 are assigned to the corresponding elements.

The portion of the X-ray mask 3 corresponds to the view taken along a line A–B. As shown in FIG. 2, the mask 3 of this embodiment has the alignment marks 6 at the adjacent two sides of the element pattern area 11.

That is, the area of the penumbra existing between the adjacent exposure shots and the area of the alignment mark are overlapped.

Figure 4:
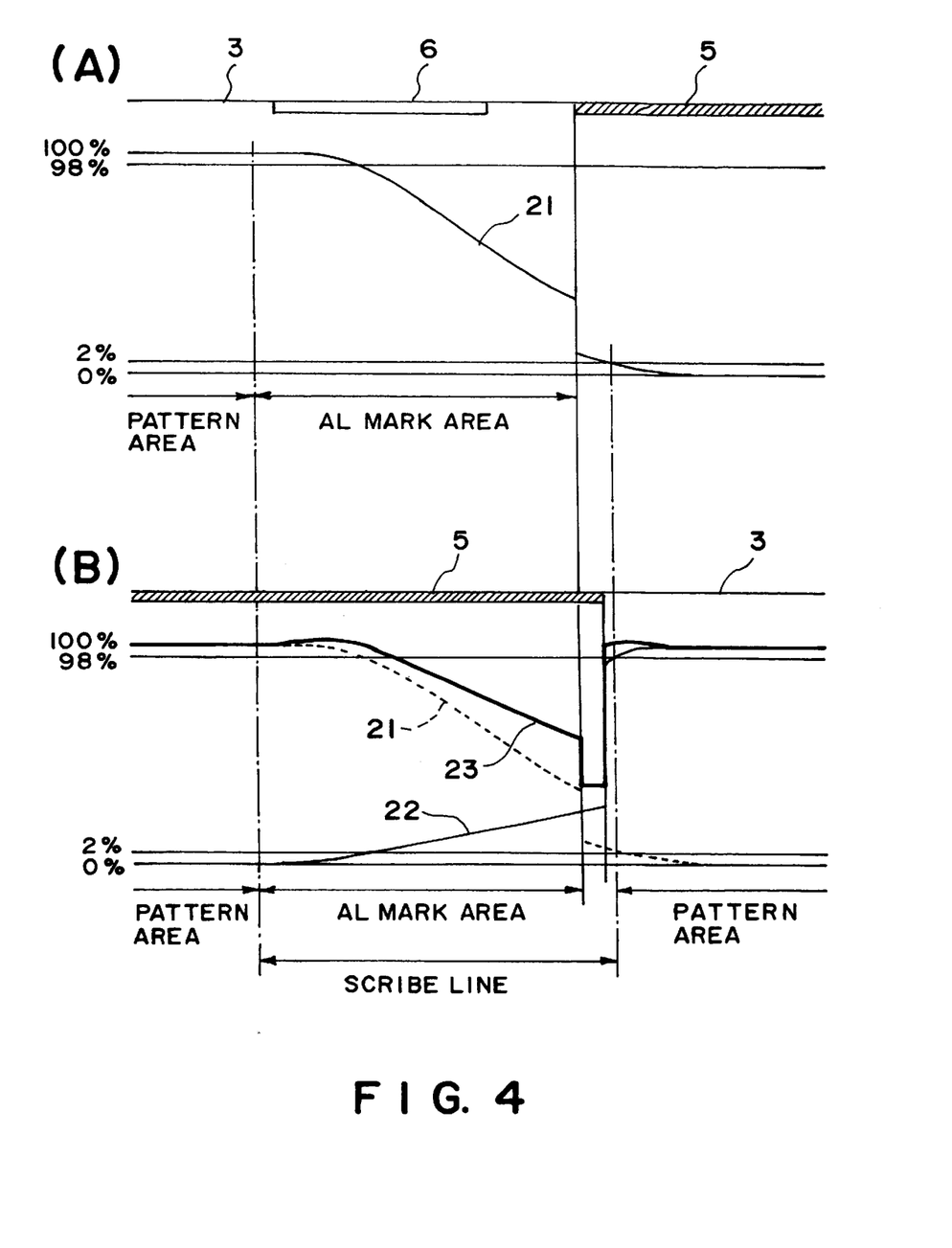
FIG. 4 is an illustration of an X-ray intensity distribution adjacent to the alignment mark of the mask according to the present invention.

The area of the mask 3 to be exposed is an inside area of the absorbing material frame 5 (element pattern area 11), and the portion of the penumbra 3a (mesial magnitude) provided by the light blocking plate 2 for limiting the exposure view angle of the exposure apparatus is set to be as indicated by the broken line 3b in the Figure. By doing so, as shown in the Figure, the exposure amount is enough in the element pattern area 11 of the mask 3, and the exposure of the alignment mark 6 uses the area in which the exposure amount begins to change due to the penumbra. Referring to FIG. 4, the description will be made as to the distribution of the exposure amount in the alignment mark portion 6 on the mask 3 in the exposure apparatus of FIG. 1, wherein (A) and (B) show the scribe line between the element pattern areas 11 at the center.

FIG. 4, (A), shows a righthand side of the mask 3 shown in FIG. 2, that is, a portion close to a point B in A–B section, when the left side of element pattern area 41 is exposed.

In FIG. 4, (A), there is shown a positional relation of the distribution of the exposure intensity of the penumbra area provided by the light blocking plate (not shown) of the exposure apparatus relative to the position of the absorbing material 5 outside the alignment mark 6 on the mask 3. The intensity distribution of the exposure X-rays on the surface of the wafer 4 is such that the intensity decreases away from the element pattern area 11 toward the outside, and the edge of the penumbra area is limited by the outside absorbing material 5 on the mask 3.

Therefore, the distribution of the exposure amount is as shown by a curve 21 in the Figure, and the alignment mark 6 is exposed to the exposure amount.

FIG. 4, (B) illustrates the case in which the righthand side is exposed. The boundary region when the righthand side is exposed in FIG. 4, is the portion close to point A of the left part of the mask shown in FIG. 2, as will be understood from FIG. 2 showing the positions of the element pattern area 11 of the mask 3 and the absorbing material 5.

At this side, there is no alignment mark, and therefore, the absorbing material frame 5 is provided immediately outside the element pattern area 11, so that the exposure amount distribution is as shown by a curve 22 in FIG. 4, (B). By the two exposures, an integrated exposure amount is provided. The scribe line between the two element pattern areas has a distribution as indicated by a curve 23.

Figure 5:
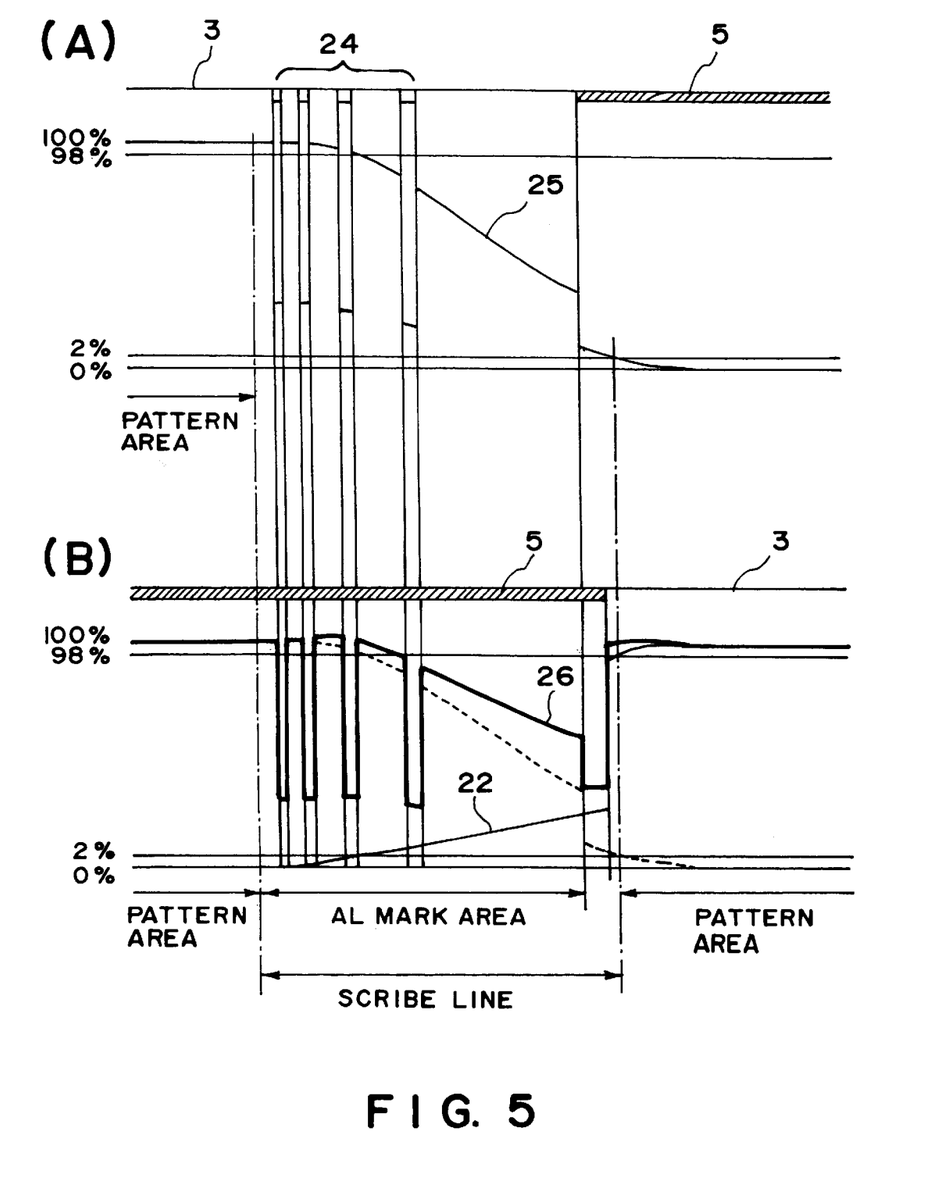
FIG. 5 is an illustration of an X-ray intensity distribution adjacent to an alignment mark comprising a plurality of line patterns on the mask.

FIG. 5, (A) and (B), illustrates a specific example of the exposure method according to the present invention, using the arrangement shown in FIG. 4, (A), (B).

The alignment mark 6 shown in FIG. 4 comprises a pattern (alignment pattern) 24 including a plurality of lines as shown in FIG. 5. The alignment pattern 24 is made of absorbing material and is provided on the mask 3.

FIG. 5, (B) shows an integrated exposure amount by a curve 26 when the alignment mark pattern (alignment pattern) 24 is exposed to the changing exposure amount provided by the penumbra, and the exposure is slightly influenced by the exposure of the adjacent shot.

As shown by the curve 26, the exposure amount distribution is not an ideal one, but the alignment mark 24 is usually detected using light having a long wavelength such as ultraviolet radiation to infrared radiation, and the line width of the alignment mark 24 is larger than the line width in the element pattern area 11 in the X-line exposure. Therefore, the tolerance of the exposure amount for the alignment mark is relatively larger, so that resolution is satisfactory if the exposure amount contrast is as indicated by the curve 26.

In other words, the line width of the alignment mark is determined such that resolution is satisfactory with the exposure amount contrast indicated by the curve 26.

As shown in FIG. 2, the absorbing material 5 in the outer periphery of the element pattern area 11 is provided except for the portion of the alignment mark 6. When the wafer 4 is exposed using the mask 3, the resist of the portion except for the alignment mark 6 of the scribe line portion on the wafer 4 is not exposed. On the contrary, when it is necessary to expose the scribe line, the absorbing material 5 is disposed to provide a pattern shown in FIG. 3.

Figure 3:
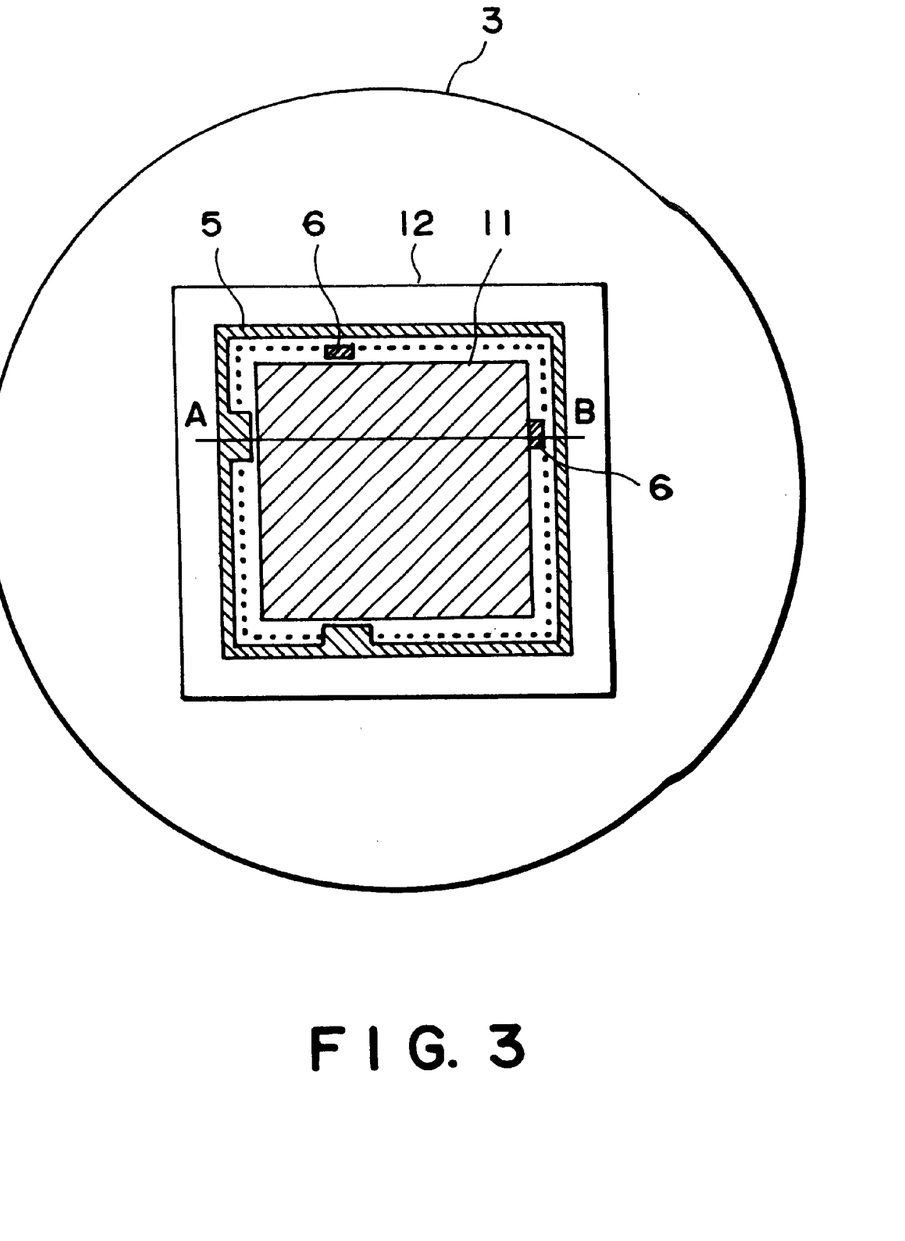
FIG. 3 is a top plan view of a major part of a mask which is needed to expose the scribe line in Embodiment 1.

When the alignment mark 6 is renewed on the scribe line, the resist except for the alignment mark portion of the scribe line is left, and in view of this, the pattern of the absorbing material 5 is preferably shown in FIG. 2 when the use is made with a positive resist, and the pattern of the absorbing material 5 is preferably as shown in FIG. 3 when the use is made with a negative resist.

As described in the foregoing, the alignment mark is exposed to the radiation utilizing the penumbra portion provided by the light blocking plate for limiting the exposure view angle of the exposure apparatus, so that the width of the scribe line can be reduced from the conventional width (the alignment mark region and the penumbra area are separately arranged).

Figure 6:
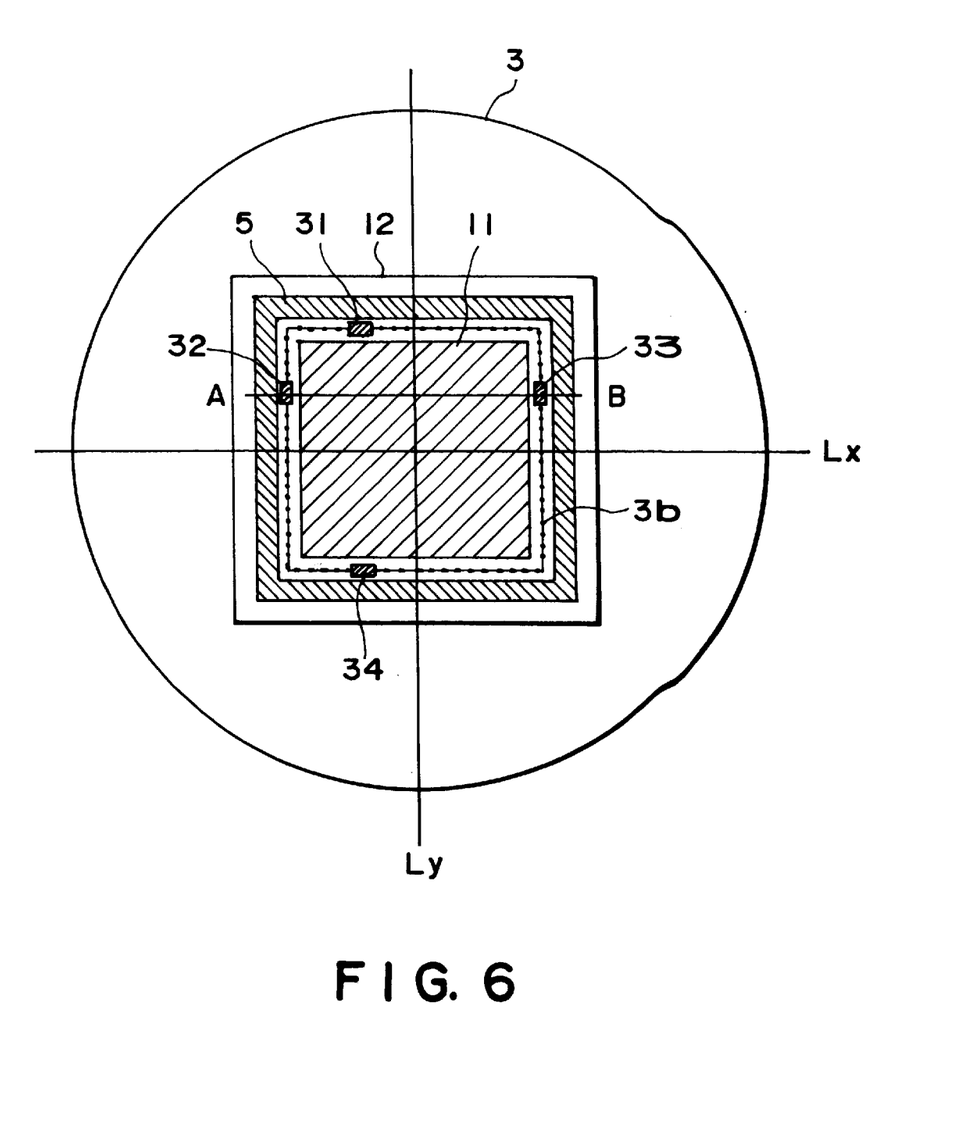
FIG. 6 is a top plan view of a major part of a mask according to an embodiment of the present intention.

FIG. 6 is a top plan view of the major part of the mask according to Embodiment 2 of the present invention. In this embodiment, alignment marks having the same patterns are disposed at the left, right, top and bottom sides of the element pattern area 11 of the mask 3, respectively, at symmetric positions about the center lines Lx, Ly.

The light blocking plate is disposed such that an area of penumbra provided by the light blocking plate for blocking the X-rays to limit the exposure view angle of the exposure apparatus is overlapped with the alignment mark. By doing so, the width of the scribe line is reduced according to this embodiment. In FIG. 6, the alignment marks 31–34 are disposed at all of the four outer sides of the element pattern area 11. Additionally, the left and right alignment marks 32 and 33 and the top and bottom alignment marks 31 and 34 are disposed at symmetric positions about the center lines Lx, Ly, and the alignment marks at the left and right sides are the same, and the top and bottom alignment marks are the same.

When the exposure operation is carried out using such a mask, the area in which the projection intensity changes by the penumbra provided by the light blocking plate of the exposure apparatus is overlapped with the left, right, top and bottom alignment marks, more particularly, the mesial magnitude portions of the penumbra indicated by the broken line 3b in the Figure is aligned with the centers of the alignment marks 31–34.

Figure 7:
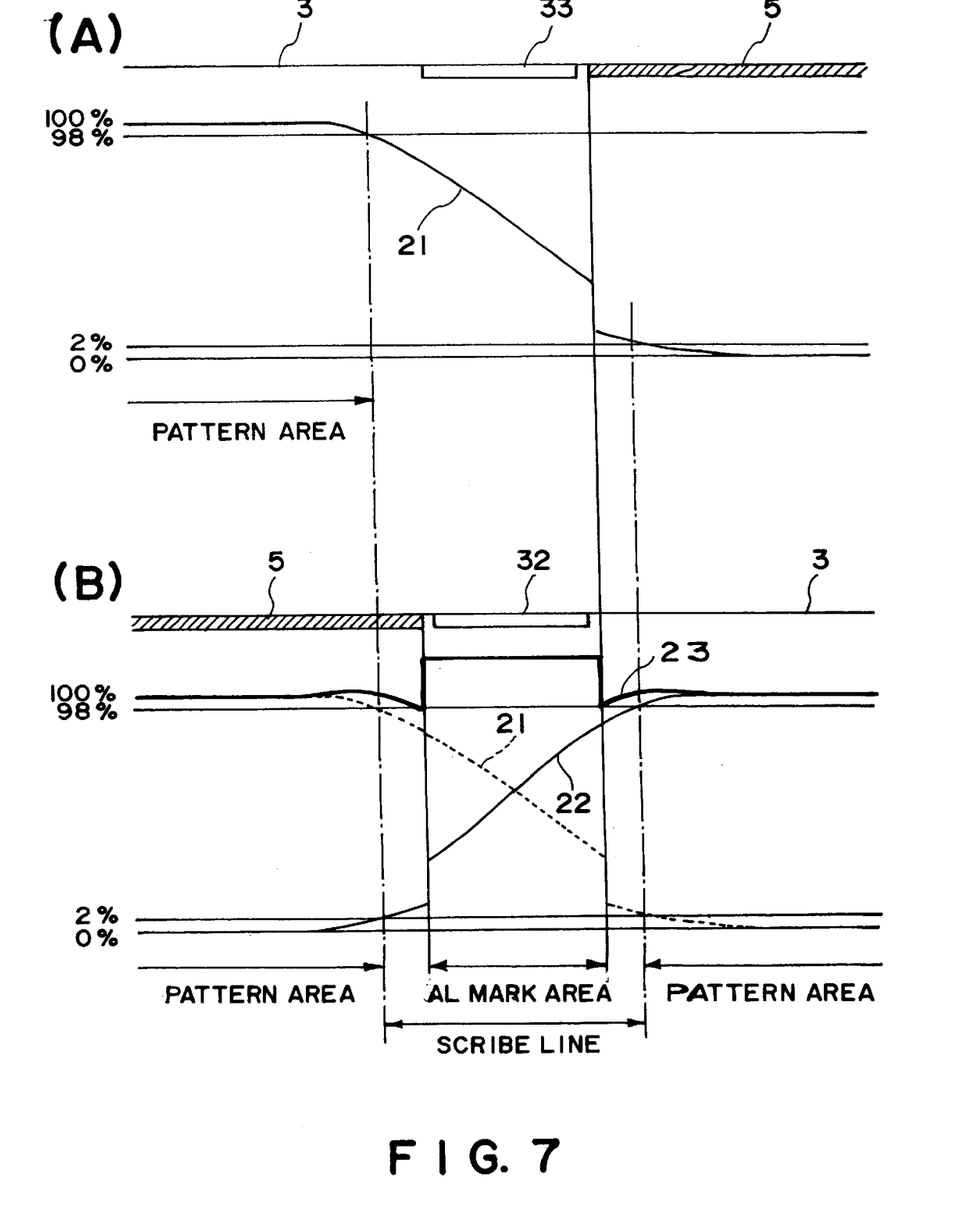
FIG. 7 is an illustration of an X-ray intensity distribution adjacent to the alignment mark of the mask according to an embodiment of the present invention.

With the step-and-repeat operation of exposure, the scribe line can be exposed with the exposure amount distributions 21, 22 as shown in FIG. 7, (A) and (B).

FIG. 7 (A) shows a state of a portion close to the point B in A–B cross section, that is, the righthand side portion of the mask shown in FIG. 6, upon the left side of the element pattern area is exposed.

FIG. 7, (A) shows a positional relation of the distribution of the exposure intensity of the penumbra provided by the light blocking plate (not shown) of the exposure apparatus relative to the absorbing material 5 outside the alignment mark 33 on the mask.

The intensity distribution by the exposure X-rays on the surface of the wafer is such that intensity lowers away from the element pattern area 11 toward the outside, and the edge of the penumbra is limited by the outside absorbing material 5 on the mask.

Therefore, the exposure amount distribution is as shown by a curve 21 in the Figure, and the alignment mark is exposed with the exposure amount. FIG. 7, (B) illustrates the case in which the righthand side is exposed. In FIG. 7, (B), the boundary region when the righthand side is exposed corresponds to the portion close to point A in the left part of the mask in FIG. 6.

The alignment mark 32 at this side is exactly the same as the alignment mark 33 at the right side in the Figure, and they are disposed symmetrically about the center line. The exposure amount at this time is as shown by a curve 22 in FIG. 7, (B), that is, it is a reversal of the curve of FIG. 7, (A). By the two exposure operations, the integrated exposure amount for the scribe line between the two element pattern areas is as indicated by a curve 23.

Figure 8:
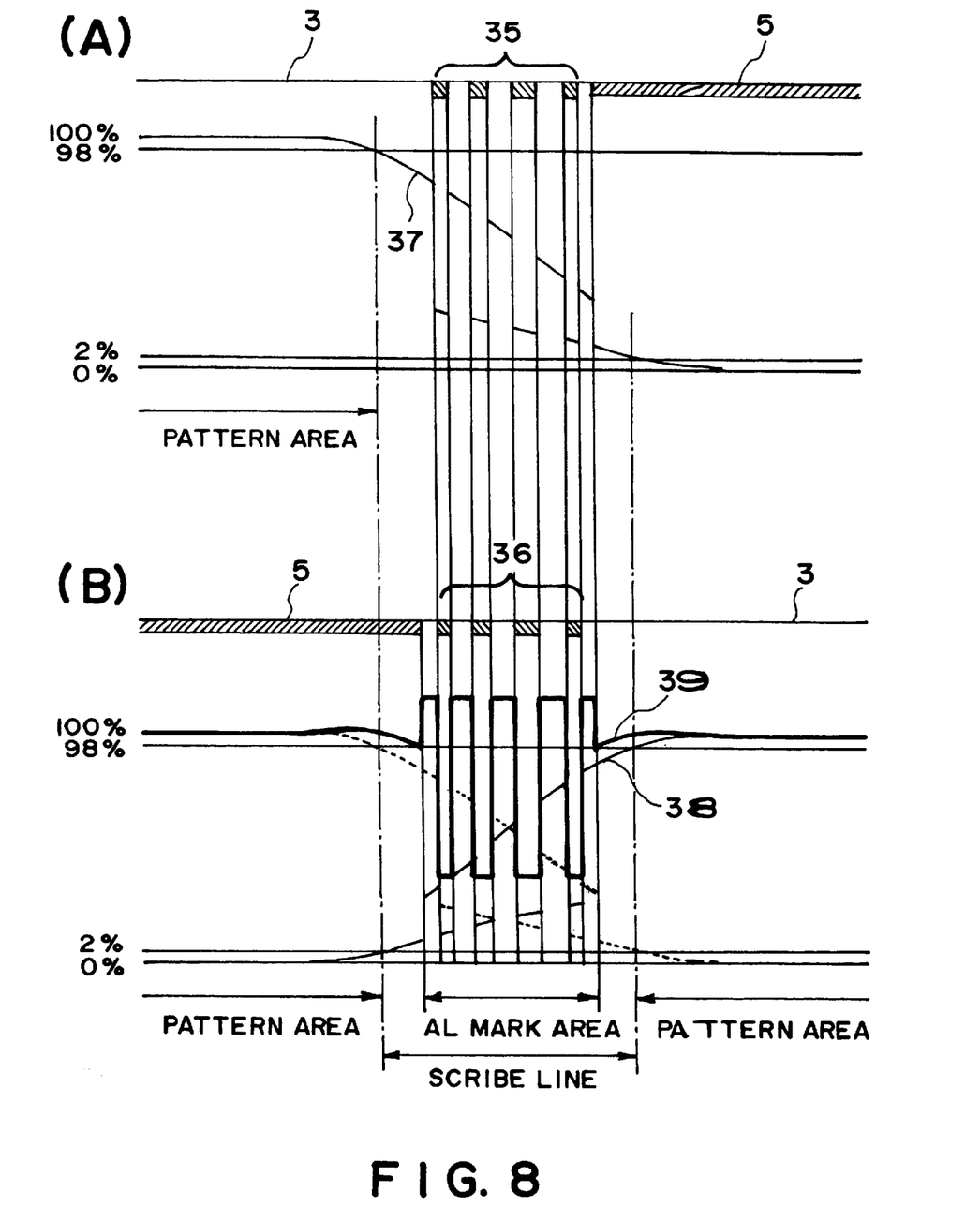
FIG. 8 is an illustration of an X-ray intensity distribution adjacent to the alignment mark comprising a plurality of line patterns.

Referring to FIG. 8, (A) and (B), a specific example of the exposure method according to the present invention shown in FIG. 7, (A) and (B), will be described.

The alignment marks 32, 33 shown in FIG. 7 each comprises a pattern 35, 36 (alignment pattern) including a plurality of lines as shown in the FIG. 8. The alignment patterns 36, 35 are made of absorbing material on the mask 3. The alignment mark pattern 35 is exposed to the portion where the exposure amount is changing due to the penumbra, and the exposure amount is as indicated by curve 37. Then, the alignment mark pattern 36 at the opposite side is exposed when the adjacent shot is exposed, and the exposure amount distribution is as indicated by curve 38.

The integrated exposure amount which is a sum of them is indicated by curve 39, and the alignment mark pattern is exposed to the radiation having the exposure amount represented by the curve 39. As indicated by the curve 39, the exposure amount is not an ideal one, and involves foggy background, but since the alignment mark 35 is normally detected by light having a long wavelength (ultraviolet radiation to infrared radiation), the line width of the alignment mark 35 is large as compared with the line width in the element pattern area 11 in the X-line exposure.

Therefore, the tolerance of the exposure amount is relatively larger, and for this reason, the contrast of the exposure amount provided by the curve 39 is enough for resolution. There is a liability of pattern deviation due to the dual exposure, but this does not bring about any practical problem in view of the positioning accuracy required in the X-line exposure system.

In the foregoing, two examples have been described in which the alignment mark is exposed using the penumbra portion, but these examples are different from each other in the positions of the alignment marks. In Embodiment 1, the alignment mark is preferably disposed close to the element pattern area 11, and in Embodiment 2, the center of the alignment mark is preferably aligned with the center of the penumbra portion.

Figure 10:
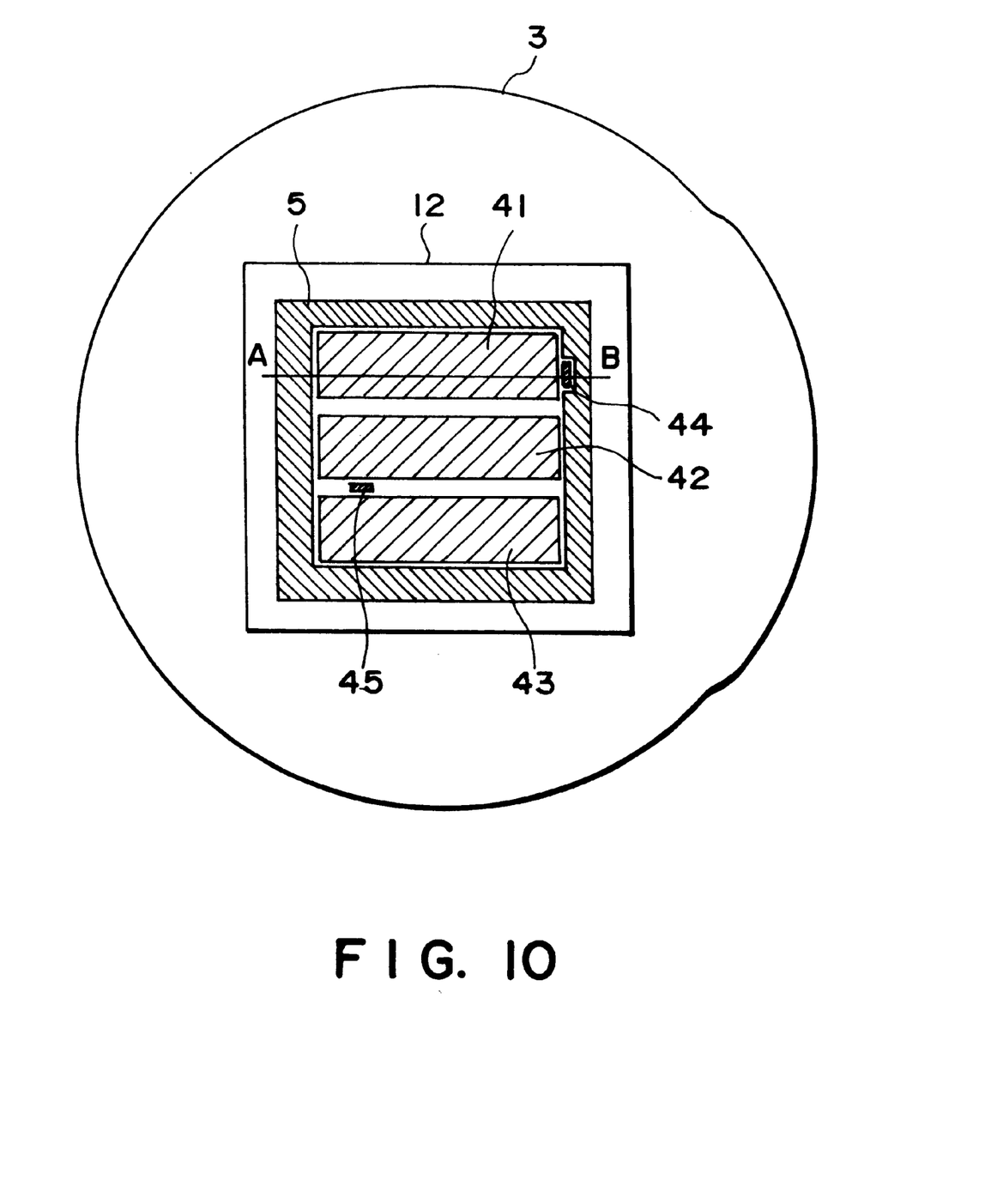
FIG. 10 is a schematic view of a major part of a mask according to a third embodiment of the present invention.

FIG. 10 schematically shows a major part of a mask wherein designated by 41, 42, 43 are element pattern areas, and 44, 45 are alignment marks.

In Embodiments 1, 2, the configurations of the element pattern areas in the masks are not limited, but in this embodiment, as shown in FIG. 10, two or more element pattern areas are provided juxtaposed in a single mask (in this Figure, three element pattern areas are provided). It is one of the advantages that the exposure area of one shot is larger than that of the exposure area in the system using the ultraviolet radiation or the excimer laser, so that a larger number of element pattern areas can be exposed by one shot. In such a case, the alignment mark 45 can be disposed between the element pattern areas, as shown in FIG. 10.

Usually, two alignment marks are necessary for orthogonal two directions (X direction and Y direction), respectively. In the case that two or more lines of the element pattern areas are provided in a single mask, the alignment marks for the orthogonal two directions can be disposed between the element pattern areas. However, as shown in FIG. 10, when the element pattern areas 41, 42, 43 are juxtaposed, only one alignment mark 44 is disposed at the outside for one direction. The alignment mark 44 is exposed using the penumbra portion provided by the light blocking plate of the exposure apparatus in the same manner as with Embodiment 1 or Embodiment 2. With this arrangement, at least the alignment mark for one direction can be exposed under the same condition as the element pattern area.

This is desirable when the diverging angle of the radiation from the exposure light source (SR) is different in the X, Y directions.

In such a case, the diverging angle toward the mask and the wafer is different. Therefore, the penumbra is also different, and the Y direction for which the alignment mark 44 is provided as shown in FIG. 10 is aligned with the reducing direction of the penumbra, by which the scribe line width can be reduced.

In the manufacturing of devices using the exposure method of Embodiment 1, 2 or 3, there are a step of relative alignment between the mask and the wafer, a step of exposing the wafer surface to the pattern on the mask and a step of performing a developing process of the wafer.

According to this invention, there is provided an exposure method and an exposure apparatus wherein the exposure and transfer of the alignment mark onto the wafer surface can be carried out with high efficiency, without expanding the width of the scribe line, so that devices can be manufactured efficiently.

According to the present invention, the alignment mark can be exposed utilizing the penumbra provided by the light blocking plate for limiting the exposure view angle of the exposure apparatus, so that the width of the scribe line can be reduced in the conventional apparatus or method in which the alignment mark region and the penumbra region are separately provided, and as a result, the exposure area can be expanded so that devices can be efficiently manufactured.

While the invention has been described with reference to the structures disclosed herein, it is not confined to the details set forth and this application is intended to cover such modifications or changes as may come within the purposes of the improvements or the scope of the following claims.

What is claimed is:

1. An exposure method using X-rays as exposure radiation, said apparatus comprising:
    a step of providing a light blocking plate disposed in an optical path, for blocking the exposure radiation;
    a step of limiting an exposure view angle on a mask by the light blocking plate so that a penumbra region provided on the mask by the light blocking plate covers an alignment mark portion of the mask, wherein the alignment mark portion is disposed at least at one position inside a low light intensity region and outside an element pattern on the mask; and
    a step of exposing a photosensitive substrate to a pattern within the exposure view angle on the mask to transfer the pattern onto the photosensitive substrate.

2. A method according to claim 1, wherein the alignment mark portion is provided at each of outer sides of the element pattern on the mask.

3. An exposure method using X-rays as exposure radiation, said method comprising:
    a step of providing a light blocking plate, disposed in an optical path, for blocking the exposure radiation;
    a step of limiting an exposure view angle on a mask by the light blocking plate so that a penumbra region provided on the mask by the light blocking plate covers an alignment mark portion of the mask, wherein the alignment mark portion is provided at each of positions which are outside of an element pattern on the mask and which are symmetric about a center line Lx of the mask and positions which are outside of an element pattern on the mask and which are symmetric about a center line Ly which is perpendicular to the center line Lx; and
    a step of exposing a photosensitive substrate to a pattern within the exposure view angle on the mask to transfer the pattern onto the photosensitive substrate.

4. An exposure apparatus, using X-rays as exposure radiation, for exposing a photosensitive substrate to a pattern within an exposure view angle on a mask to transfer the pattern onto the photosensitive substrate, said apparatus comprising:
    a light blocking plate, disposed in an optical path for the exposure radiation, for limiting the exposure view angle on the mask by blocking the exposure radiation; and
    driving means for driving the light blocking plate such that a penumbra region provided on the mask by said light blocking plate covers an alignment mark portion formed on the mask, wherein the alignment mark portion is provided at least at one position in a low light intensity region and outside the element pattern on the mask.

5. An exposure apparatus using X-rays as exposure radiation, for exposing a photosensitive substrate to a pattern within an exposure view angle on a mask to transfer the pattern onto the photosensitive substrate, said apparatus comprising:
    a light blocking plate, disposed in an optical path for the exposure radiation, for limiting the exposure view angle on the mask by blocking the exposure radiation; and
    driving means for driving the light blocking plate such that a penumbra region provided on the mask by said light blocking plate covers an alignment mark portion formed on the mask, wherein the alignment mark portion is provided at each of positions which are outside of an element pattern on the mask and which are symmetric about a center line Lx of the mask and positions which are outside of an element pattern on the mask and which are symmetric about a center line Ly which is perpendicular to the center line Lx.

6. A semiconductor device manufacturing method comprising:
    a step of performing alignment between a mask and a photosensitive substrate;
    an exposure step for exposing the photosensitive substrate to a pattern within an exposure view angle on the mask to transfer the pattern onto the photosensitive substrate, using X-ray radiation as exposure radiation, said exposure step including:
    (i) a step of providing a light blocking plate, disposed in an optical path, for blocking the exposure radiation; and
    (ii) a step of limiting an exposure view angle on a mask by the light blocking plate so that a penumbra region provided on the mask by the light blocking plate covers an alignment mark portion of the mask, wherein the alignment mark portion is provided at least at one position inside a low light intensity region and outside an element pattern on the mask; and
    a step of developing the photosensitive substrate onto which the pattern has been transferred.

7. A semiconductor device manufacturing method comprising:
    a step of performing alignment between a mask and a photosensitive substrate;
    an exposure step for exposing the photosensitive substrate to a pattern within an exposure view angle on the mask to transfer the pattern onto the photosensitive substrate, using X-ray radiation as exposure radiation, said exposure step including:

(i) a step of providing a light blocking plate, disposed in an optical path, for blocking the exposure radiation; and (ii) a step of limiting an exposure view angle on a mask by the light blocking plate so that a penumbra region provided on the mask by the light blocking plate covers an alignment mark portion of the mask, wherein the alignment mark portion is provided at each of positions which are outside of an element pattern on the mask and which are symmetric about a center line Lx of the mask and positions which are outside of an element pattern on the mask and which are symmetric about a center line Ly which is perpendicular to the center line Lx; and a step of developing the photosensitive substrate onto which the pattern has been transferred.

\* \* \* \* \*

UNITED STATES PATENT AND TRADEMARK OFFICE
CERTIFICATE OF CORRECTION

PATENT NO.     : 6,453,000 B1                                              Page 1 of 1
DATED          : September 17, 2002
INVENTOR(S)    : Shigeru Terashima et al.

It is certified that error appears in the above-identified patent and that said Letters Patent is hereby corrected as shown below:

<u>Title page,</u>
Item [56], References Cited, insert the following:
--             FOREIGN PATENT DOCUMENTS
       JP        7-283128      10/1995
       JP        7-281417      10/1995
       JP        10-294272     11/1998 --.

Signed and Sealed this

Sixteenth Day of March, 2004

JON W. DUDAS
*Acting Director of the United States Patent and Trademark Office*